(12) United States Patent
Gerken et al.

(10) Patent No.: US 8,363,406 B2
(45) Date of Patent: Jan. 29, 2013

(54) ROTATABLE LATCH FOR COMPRESSING THERMAL INTERFACE MATERIAL BETWEEN A HEAT GENERATING ELECTRICAL COMPONENT AND A COOLING ELECTRICAL COMPONENT

(75) Inventors: James D. Gerken, Zumbro Falls, MN (US); Jeffrey L. Justin, Oronoco, MN (US); Christopher M. Marroquin, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 12/971,222

(22) Filed: Dec. 17, 2010

(65) Prior Publication Data

US 2012/0155018 A1 Jun. 21, 2012

(51) Int. Cl.
*H05K 7/20* (2006.01)
*F28F 7/00* (2006.01)
*H01L 23/34* (2006.01)

(52) U.S. Cl. ...... 361/704; 165/80.2; 165/80.3; 165/80.4; 165/185; 257/719; 361/699; 361/715; 361/719

(58) Field of Classification Search ........................ None
See application file for complete search history.

(56) References Cited

U.S. PATENT DOCUMENTS

| | | | |
|---|---|---|---|
| 4,285,094 A | | 8/1981 | Levings, Jr. |
| 5,784,257 A | * | 7/1998 | Tata .............................. 361/704 |
| 5,932,925 A | * | 8/1999 | McIntyre ...................... 257/719 |
| 6,050,658 A | | 4/2000 | O'Sullivan et al. |
| 6,501,657 B1 | * | 12/2002 | Carr .............................. 361/704 |
| 6,724,629 B1 | * | 4/2004 | Augustin et al. .............. 361/704 |
| 6,965,512 B2 | | 11/2005 | Huang et al. |
| 7,009,843 B2 | * | 3/2006 | Lee et al. ...................... 361/704 |
| 7,095,619 B2 | * | 8/2006 | Panella et al. ................. 361/760 |
| 7,215,550 B1 | * | 5/2007 | Yang et al. .................... 361/704 |
| 7,224,587 B2 | | 5/2007 | Dittus et al. |
| 7,327,573 B2 | * | 2/2008 | Lee et al. ...................... 361/704 |
| 7,486,516 B2 | * | 2/2009 | Colbert et al. ................ 361/710 |

(Continued)

OTHER PUBLICATIONS

Southco, Inc., "Versa Latch Tension Latch," Southco Latches and Access Hardware Handbook 45 NA, Southco Inc., Concordville, PA, 1995, pp. H-14-H-15.

(Continued)

*Primary Examiner* — Gregory Thompson
(74) *Attorney, Agent, or Firm* — Edward J. Lenart; Cynthia G. Seal; Biggers & Ohanian, LLP.

(57) ABSTRACT

Apparatuses are provided for compressing a thermal interface material between a heat generating electronic component and a cooling electrical component. Embodiments include a rotatable latch fastened to the heat generating electrical component, the rotatable latch including a hook; wherein when the rotatable latch is in an engaged position, the hook of the rotatable latch engages a pin extending from the cooling electrical component such that the thermal interface material adhered to the heat generating electrical component is coupled to the cooling component; when the rotatable latch is in an unengaged position, the hook of the rotatable latch is not engaged with the pin of the cooling electrical component; a load screw; wherein when the rotatable latch is in the engaged position, threading the load screw into the rotatable latch moves the rotatable latch into a locked state; and a spring leaf that is coupled to the heat generating electrical component.

20 Claims, 9 Drawing Sheets

U.S. PATENT DOCUMENTS

2007/0268672 A1* 11/2007 Barsun et al. .................. 361/710
2008/0024991 A1* 1/2008 Colbert et al. ................. 361/704
2009/0151896 A1 6/2009 Chen et al.
2009/0174195 A1 7/2009 Szilagyi
2010/0035447 A1 2/2010 Chen et al.
2010/0067196 A1 3/2010 Costello et al.
2011/0300815 A1* 12/2011 Thompson et al. .......... 455/90.3

OTHER PUBLICATIONS

Southco, Inc., "Hook Lock Panel Latch," Southco Latches and Access Hardware Handbook 45 NA, Southco Inc., Concordville, PA, 1995, p. J-17.

* cited by examiner

FIG. 9

ROTATABLE LATCH FOR COMPRESSING THERMAL INTERFACE MATERIAL BETWEEN A HEAT GENERATING ELECTRICAL COMPONENT AND A COOLING ELECTRICAL COMPONENT

BACKGROUND OF THE INVENTION

1. Field of the Invention

The field of the invention is data processing, or, more specifically, apparatuses that include a rotatable latch for compressing a thermal interface material between a heat generating electronic component and a cooling electrical component.

2. Description of Related Art

A typical node card may be coupled to a plurality of processor cards. During operating, the processor cards generate heat. The processor cards are typically attached to a cooling rack that is designed to transfer the heat from the processor card to the cooling racks. To aid in the transfer of the heat, thermal interface material may be placed between the processor card and the node card. Compression of the thermal interface material impacts the heat transfer between the processor card and the node card.

SUMMARY OF THE INVENTION

Apparatuses are provided for compression of thermal interface material between a heat generating electrical component and a cooling electrical component.

Embodiments include a rotatable latch fastened to the heat generating electrical component, the rotatable latch including a hook; wherein when the rotatable latch is in an engaged position, the hook of the rotatable latch engages a pin extending from the cooling electrical component such that the thermal interface material adhered to the heat generating electrical component is coupled to the cooling component; wherein when the rotatable latch is in an unengaged position, the hook of the rotatable latch is not engaged with the pin of the cooling electrical component; a load screw; wherein when the rotatable latch is in the engaged position, threading the load screw into the rotatable latch moves the rotatable latch into a locked state; wherein the load screw controls the compression of the thermal interface material between the heat generating electrical component and the cooling electrical component; and a spring leaf that is coupled to the heat generating electrical component; wherein when the rotatable latch is in the locked state, the spring leaf applies a force to the load screw such that the thermal interface material is compressed.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
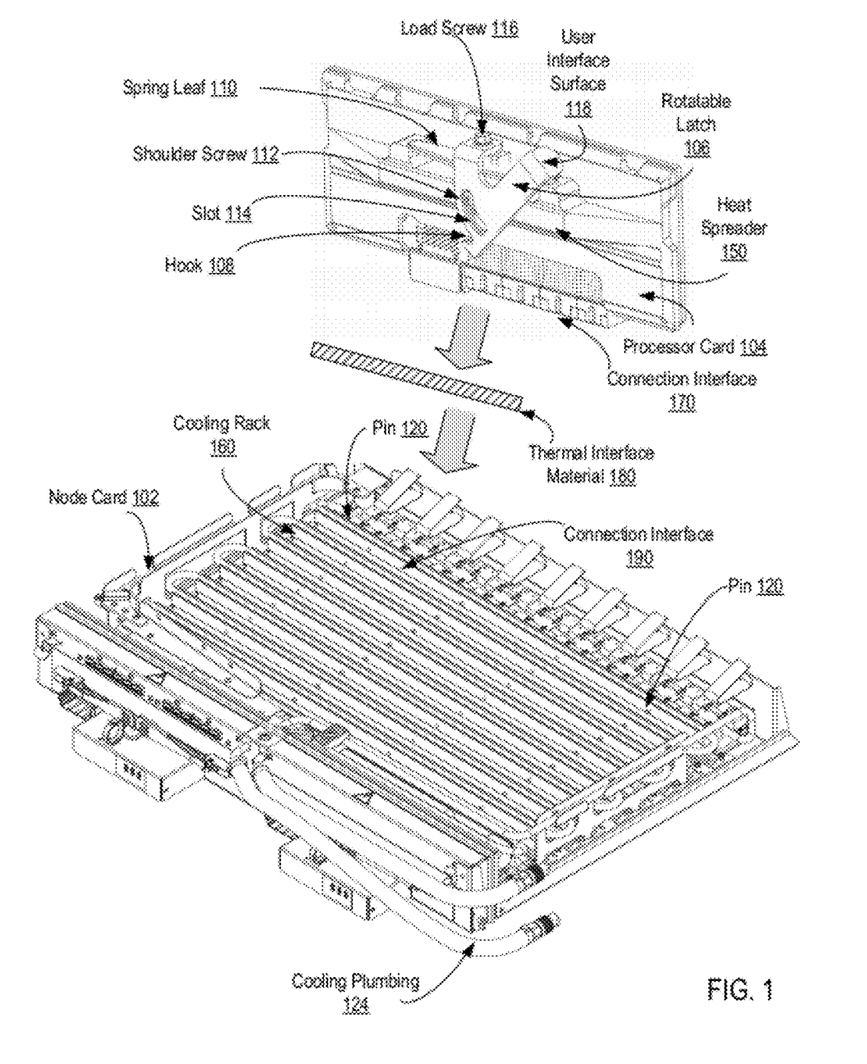
FIG. 1 sets forth a diagram of an example of an apparatus that includes a rotatable latch for compressing thermal interface material between a heat generating electrical component and a cooling electrical component in accordance with the present invention.

Examples of apparatuses that include a rotatable latch for compressing thermal interface material between a heat generating electrical component and a cooling electrical component in accordance with the present invention are described with reference to the accompanying drawings, beginning with FIG. 1. FIG. 1 sets forth a diagram of an example of an apparatus that includes a rotatable latch (106) for compressing thermal interface material (180) between a heat generating electrical component and a cooling electrical component. The processor card (104) of FIG. 1 includes a heat spreader (150) that is a heat generating electrical component and the node card (102) includes cooling racks (160) that are cooling electrical components. To compress the thermal interface material (180), the rotatable latch (106) uses a load screw (116) and a spring leaf (110).

The processor card (104) of FIG. 1 is configured to connect with the node card (102). A processor card is a printed circuit board that contains a processor, such as a central processing unit (CPU). A node card is a printed circuit board that includes connection interfaces for coupling processor cards. The node card (102) of FIG. 1 includes a connection interface (190) that is configured to form an electrical connection with a connection interface (170) of the processor card (104). The connection interface (190) of the node card (102) and the connection interface (170) of the processor card (104) enable the processor card (104) and the node card (102) to communicate when connected.

The node card (102) of FIG. 1 also includes cooling plumbing (124) for cooling the cooling rack (160). Cooling plumbing includes pipes for transporting cooled liquid. A cooling rack is a raised plate that is cooled by cooling plumbing. The cooling rack (160) of FIG. 1 includes a pin (120) that extends from the cooling rack (160). The pin (120) of FIG. 1 may be a stainless steel dowel pin that is pressed to fit into a hole in the cooling rack (160).

The heat spreader (150) of FIG. 1 is for transferring heat from the processor card (104) to one of the cooling racks (160) of the node card (102). A heat spreader is a piece of material that extends from the processor card (104) and provides a surface to transfer heat. To aid in the transfer of heat, the thermal interface material (180) of FIG. 1 may be adhered to the bottom of the heat spreader (150). A thermal interface material (TIM) is used to fill the gaps between thermal transfer surfaces, such as the cooling rack (160) and the heat spreader (150), in order to increase thermal transfer efficiency. The thermal interface material (180) of FIG. 1 may be thermal grease, such as silicone oil and aluminum oxide, zinc oxide, or boron nitride. The thermal interface material may also be a gap pad or a gap filler thermal interface material or similar material.

The rotatable latch (106) of FIG. 1 includes a slot (114). A shoulder screw (112) passes through the slot (114) of the rotatable latch (106) and into the heat spreader (150) of the processor card (104), such that the rotatable latch (106) is fastened to the processor card (104). The load screw (116) is threaded through a hole in the rotatable latch (106) and contacts the spring leaf (110). The spring leaf (110) of FIG. 1 is coupled to the heat spreader (150) of the processor card (104). The spring leaf (110) may be a pre-tempered steel plate. The slot (114) enables the rotatable latch (106) to move, relative to shoulder screw (112), between an engaged position and an unengaged position.

The processor card (104) may be inserted into the node card (102). To couple the processor card (104) to the node card (102), the rotatable latch (106) can be switched from an engaged position to an unengaged position. When the rotatable latch (106) is in the engaged position, a hook (108) of the rotatable latch (106) engages the pin (120) of the cooling rack (160) of the node card (102). From the engaged stage, the rotatable lock (106) is switched to the locked state by threading the load screw (116) into the rotatable latch (106), such that the load screw (116) presses into the spring leaf (110), causing the spring leaf (110) to bend. In the locked state, the force from the spring leaf (110) and the load screw (116) pressed together, compresses the thermal interface material (180) between the heat spreader (150) of the processor card (104) and the cooling rack (160) of the node card (102). The degree of compression of the thermal interface material (180) is controllable by threading or unthreading the load screw (116). Unthreading the load screw (116) from the rotatable latch (106) reduces the compression of the thermal interface material (180) and threading the load screw (116) into the rotatable latch (106) increases the compression of the thermal interface material (180).

When the rotatable latch (106) is in the locked state, unthreading the load screw (116) from the rotatable latch (106) causes the rotatable latch (106) to move into the engaged position. In the engaged position, the rotatable latch (106) may be rotated into the unengaged position. When the rotatable latch (106) is in the unengaged position, the hook (108) of the rotatable latch (106) is not engaging the pin (120) of the cooling rack (160) of the node card (102). In the unengaged position, the processor card (104) may be removed from the node card (102). The rotatable latch (106) includes a user interface surface (118) that a user may move to control the rotation of the rotatable latch (106) between the engaged position and the unengaged position.

Figure 2:
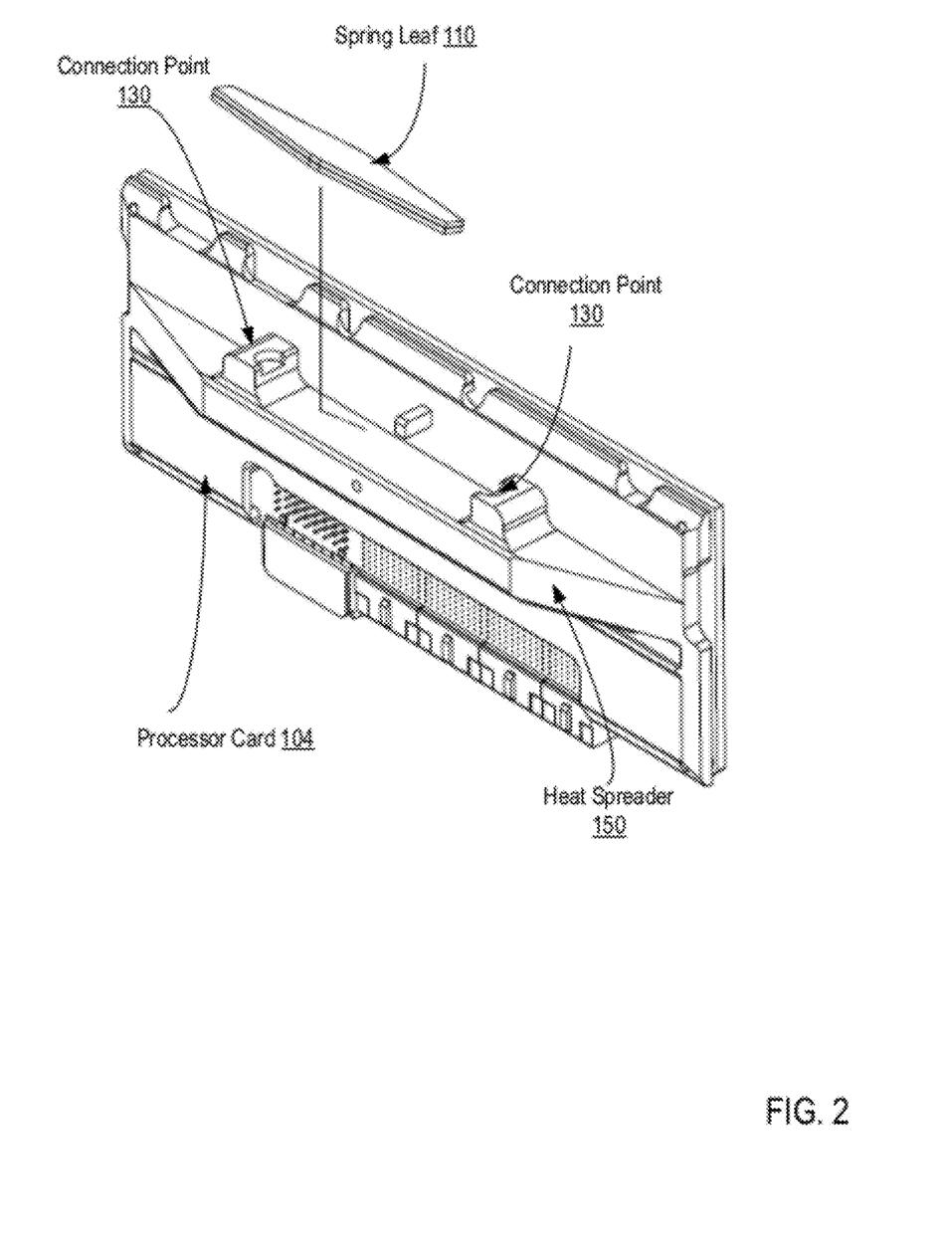
FIG. 2 sets forth a diagram of another example of an apparatus that includes a spring leaf that a rotatable latch for compressing thermal interface material between a heat generating electrical component and a cooling electrical component in accordance with the present invention.

FIG. 2 sets forth a diagram of another example of an apparatus that includes a spring leaf (110) that a rotatable latch (106) uses for compressing thermal interface material (180) between a heat generating electrical component and a cooling electrical component. The apparatus of FIG. 2 is similar to the apparatus of FIG. 1 in that it includes the spring leaf (110) and the processor card (104) with the heat spreader (150). The detailed view illustrated in FIG. 2 shows that the spring leaf (110) is coupled to the processor card (104) at two connection points (130). Each connection point (130) is positioned away from the heat spreader (150) such that there is a gap between the heat spreader (150) and the spring leaf (110). The gap between the heat spreader (150) and the spring leaf (110) enables the spring leaf (110) to deflect downwards towards the heat spreader (150) in response to a user threading the load screw (116) into the rotatable latch (106). The load screw (116) may contact the spring leaf (110) in a position that is between the two connection points (130).

Figure 3:
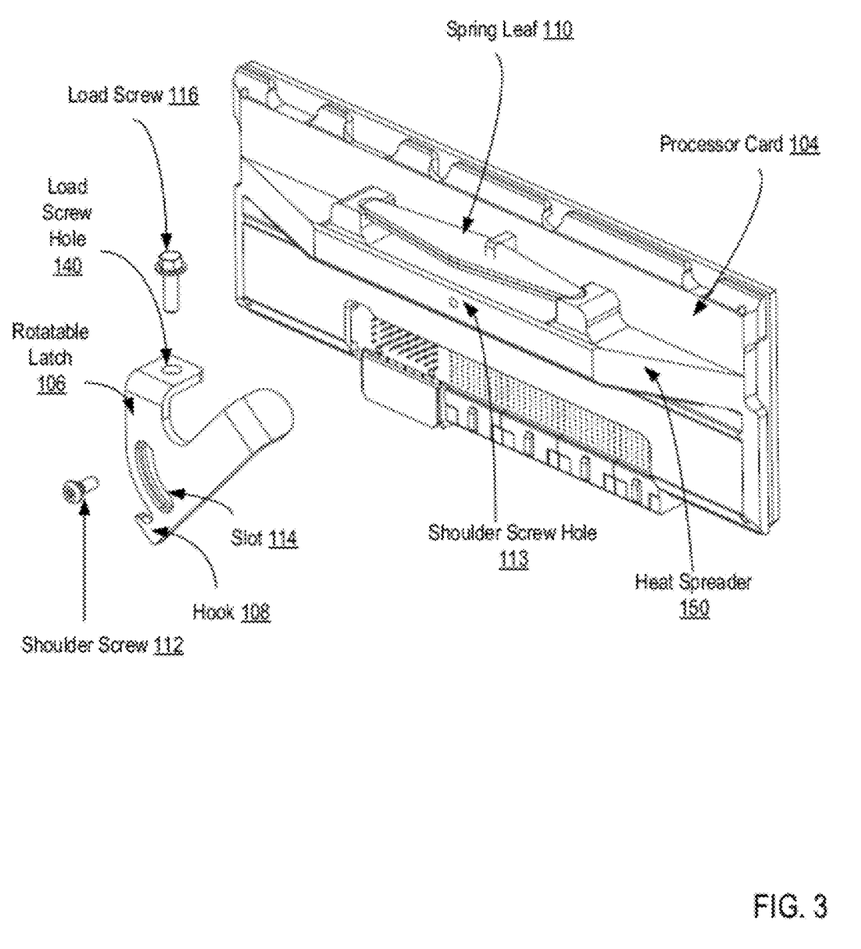
FIG. 3 sets forth a diagram of another example of an apparatus that includes a rotatable latch for compressing thermal interface material between a heat generating electrical component and a cooling electrical component in accordance with the present invention.

FIG. 3 sets forth a diagram of another example apparatus that includes a rotatable latch (106) for compressing thermal interface material (180) between a heat generating electrical component and a cooling electrical component. The apparatus of FIG. 3 is similar to the apparatus of FIG. 1 in that it includes the spring leaf (110), the shoulder screw (112), and the rotatable latch (106). The detailed view illustrated in FIG. 3 shows that the rotatable latch (106) includes a threaded load screw hole (140) that the load screw (116) is threaded into before making contact with the spring leaf (110). FIG. 3 also shows that the heat spreader (150) of the processor card (104) includes a shoulder screw hole (113) that the shoulder screw (112) passes through before being coupled to the heat spreader (150).

Figure 4:
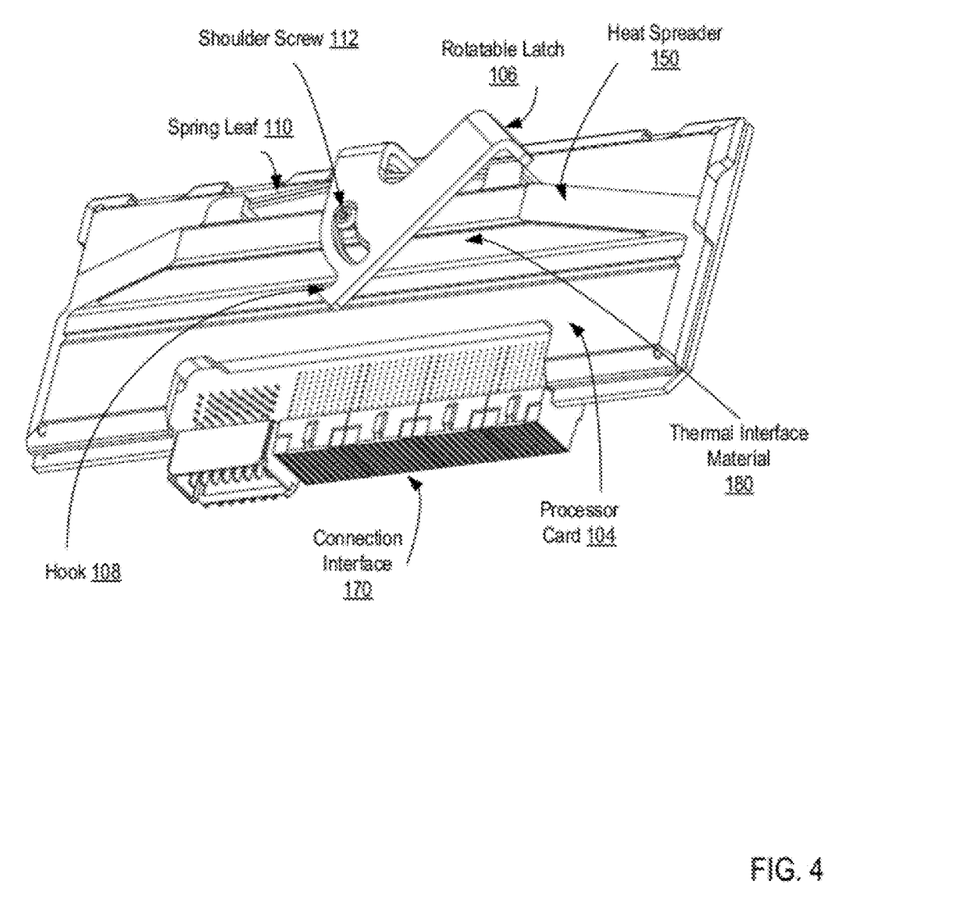
FIG. 4 sets forth a diagram of another example of an apparatus that includes a rotatable latch for compressing thermal interface material between a heat generating electrical component and a cooling electrical component in accordance with the present invention.

FIG. 4 sets forth a diagram of another example apparatus that includes a rotatable latch (106) for compressing thermal interface material (180) between a heat generating electrical component and a cooling electrical component. The apparatus of FIG. 4 is similar to the apparatus of FIG. 1 in that it includes the spring leaf (110), the shoulder screw (112), the rotatable latch (106), the thermal interface material (180), and the processor card (104). The alternative view illustrated in FIG. 4 shows the thermal interface material (180) is adhered to the bottom of the heat spreader (150). The exposed surface of the thermal interface material (180) is compressed into the cooling rack (160) of the node card (102) when the rotatable latch (106) is in the locked state.

Figure 5:
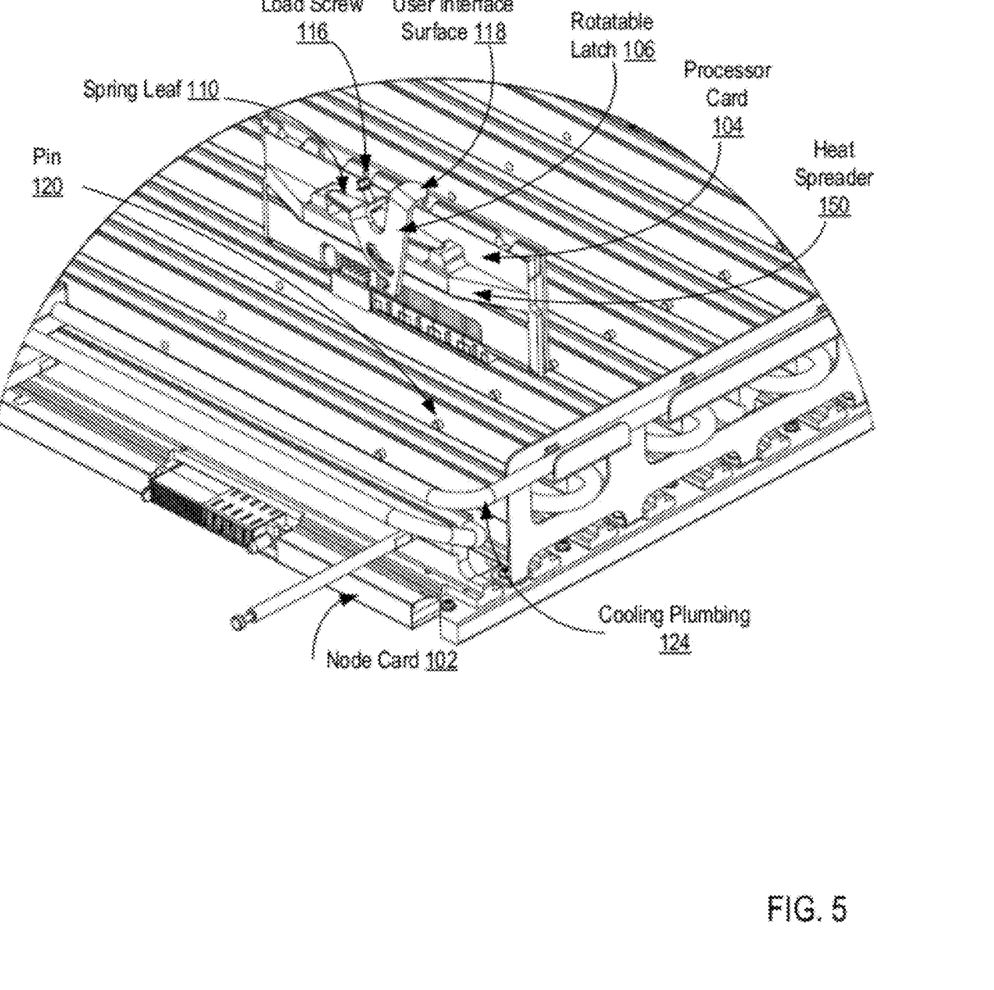
FIG. 5 sets forth an alternative view of the apparatus of FIG. 1 that includes a rotatable latch for compressing thermal interface material between a heat generating electrical component and a cooling electrical component in accordance with the present invention.

FIG. 5 sets forth an alternative view of the apparatus of FIG. 1 that includes a rotatable latch (106) for compressing thermal interface material (180) between a heat generating electrical component and a cooling electrical component. The apparatus of FIG. 5 is similar to the apparatus of FIG. 1 in that it includes the spring leaf (110), the load screw (116), the rotatable latch (106), the processor card (104), and the node card (102). The alternative view illustrated in FIG. 5 shows the processor card (104) ready for insertion into the node card (102).

Figure 6:
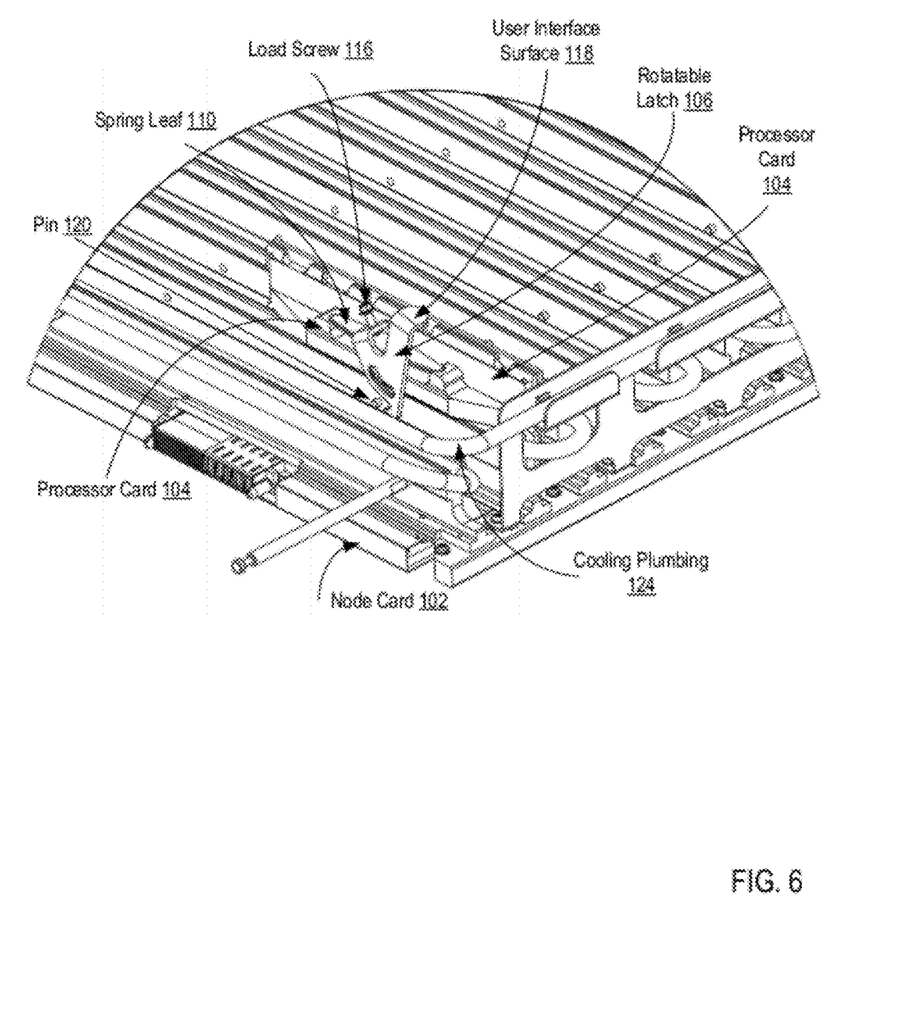
FIG. 6 sets forth a diagram of another example of an apparatus that includes a rotatable latch for compressing thermal interface material between a heat generating electrical component and a cooling electrical component in accordance with the present invention.

FIG. 6 sets forth a diagram of another example of an apparatus that includes a rotatable latch (106) for compressing thermal interface material (180) between a heat generating electrical component and a cooling electrical component. The apparatus of FIG. 6 is similar to the apparatus of FIG. 1 in that it includes the spring leaf (110), the load screw (116), the rotatable latch (106), the processor card (104), and the node card (102). FIG. 6 shows the processor card (104) inserted into the node card (102). The rotatable latch (106) is in the unengaged position. The rotatable latch (106) is in the unengaged position because the hook (108) of the rotatable latch (106) is not engaging the pin (120) of the cooling rack (160) of the node card (102). The load screw (116) of FIG. 6 is unthreaded from the rotatable latch (106) such that the rotatable latch (106) is free to rotate as the user chooses as the load screw (116) is not in contact with the spring leaf (110).

Figure 7:
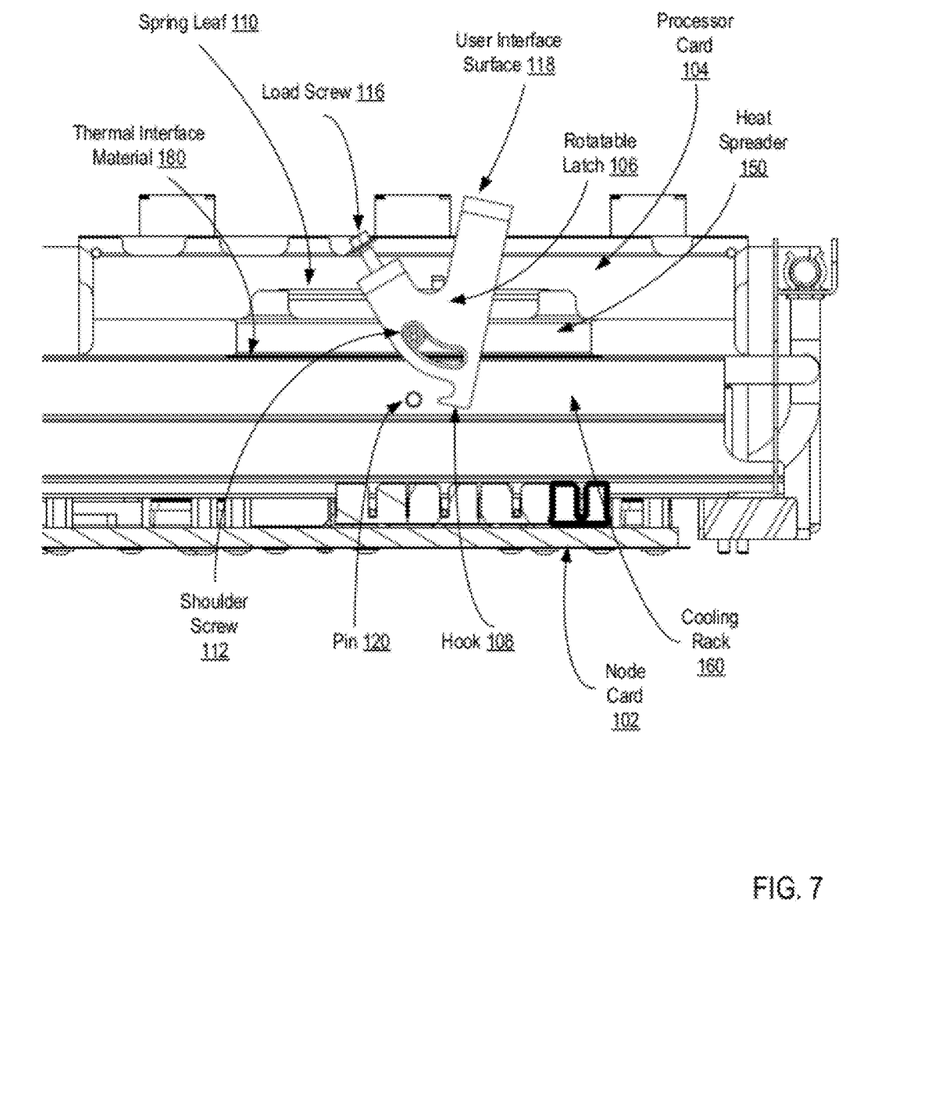
FIG. 7 sets forth an alternative view of the apparatus of FIG. 6 that includes a rotatable latch for compressing thermal interface material between a heat generating electrical component and a cooling electrical component in accordance with the present invention.

FIG. 7 sets forth an alternative view of the apparatus of FIG. 6 that includes a rotatable latch (106) for compressing thermal interface material (180) between a heat generating electrical component and a cooling electrical component. The apparatus of FIG. 7 is similar to the apparatus of FIG. 6 in that it includes the spring leaf (110), the load screw (116), the processor card (104), the node card (102), and the rotatable latch (106). The alternative view illustrated in FIG. 7 shows the user interface surface (118) of the rotatable latch (106) rotated in the unengaged position.

Figure 8:
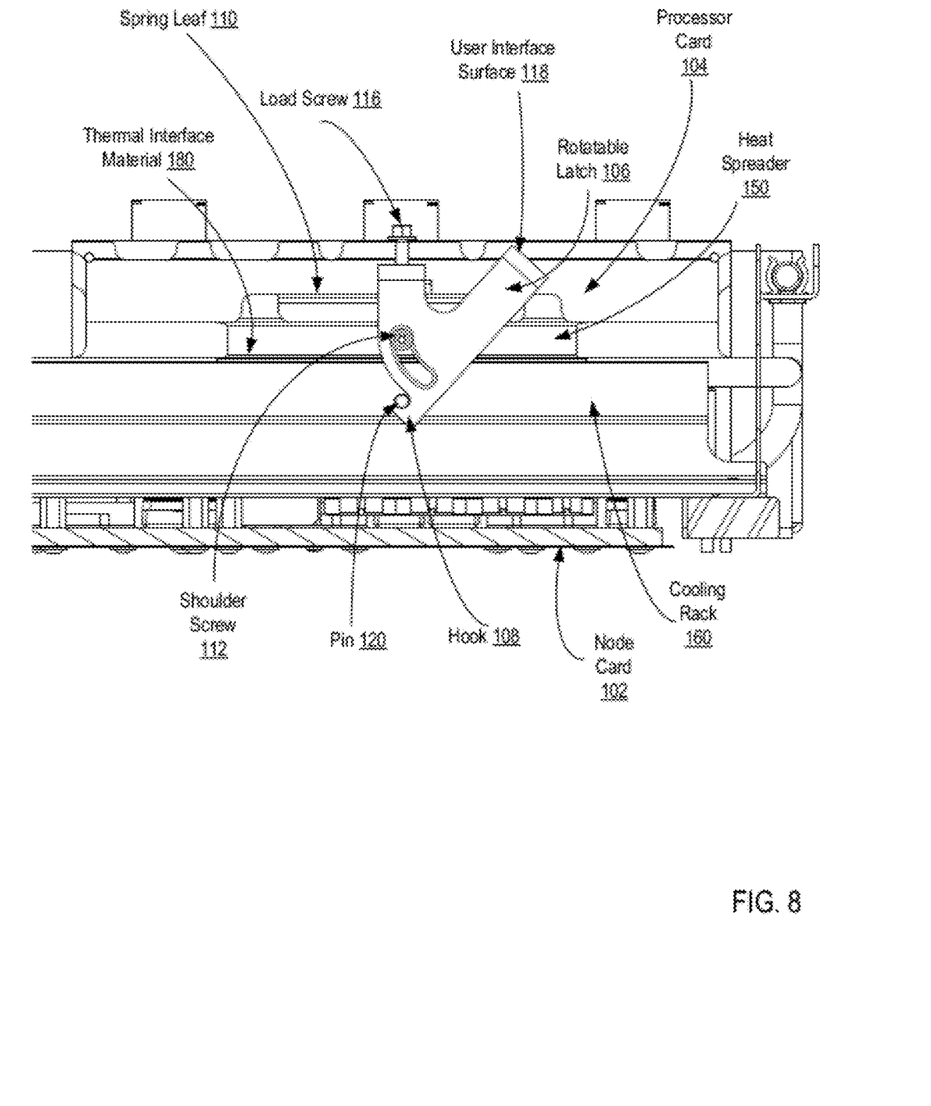
FIG. 8 sets forth a diagram of another example of an apparatus that includes a rotatable latch for compressing thermal interface material between a heat generating electrical component and a cooling electrical component in accordance with the present invention.

FIG. 8 sets forth a diagram of another example of an apparatus that includes a rotatable latch (106) for compressing thermal interface material (180) between a heat generating electrical component and a cooling electrical component. The apparatus of FIG. 8 is similar to the apparatus of FIG. 1 in that it includes the spring leaf (110), the load screw (116), the rotatable latch (106), the processor card (104), and the node card (102). FIG. 8 shows the processor card (104) inserted into the node card (102). The rotatable latch (106) of FIG. 8 is in the engaged position. The rotatable latch (106) of FIG. 8 is in the engaged position because the hook (108) of the rotatable latch (106) is engaging the pin (120) of the cooling rack (160) of the node card (102). The rotatable latch (106) of FIG. 8 is not in the locked state because the load screw (116) of FIG. 8 is not threaded all the way into the rotatable latch (106). When the rotatable latch (106) is in the engaged position but not the locked state, the thermal interface material (180) is not compressed between the heat spreader (150) of the processor card (104) and the cooling rack (160) of the node card (102).

Figure 9:
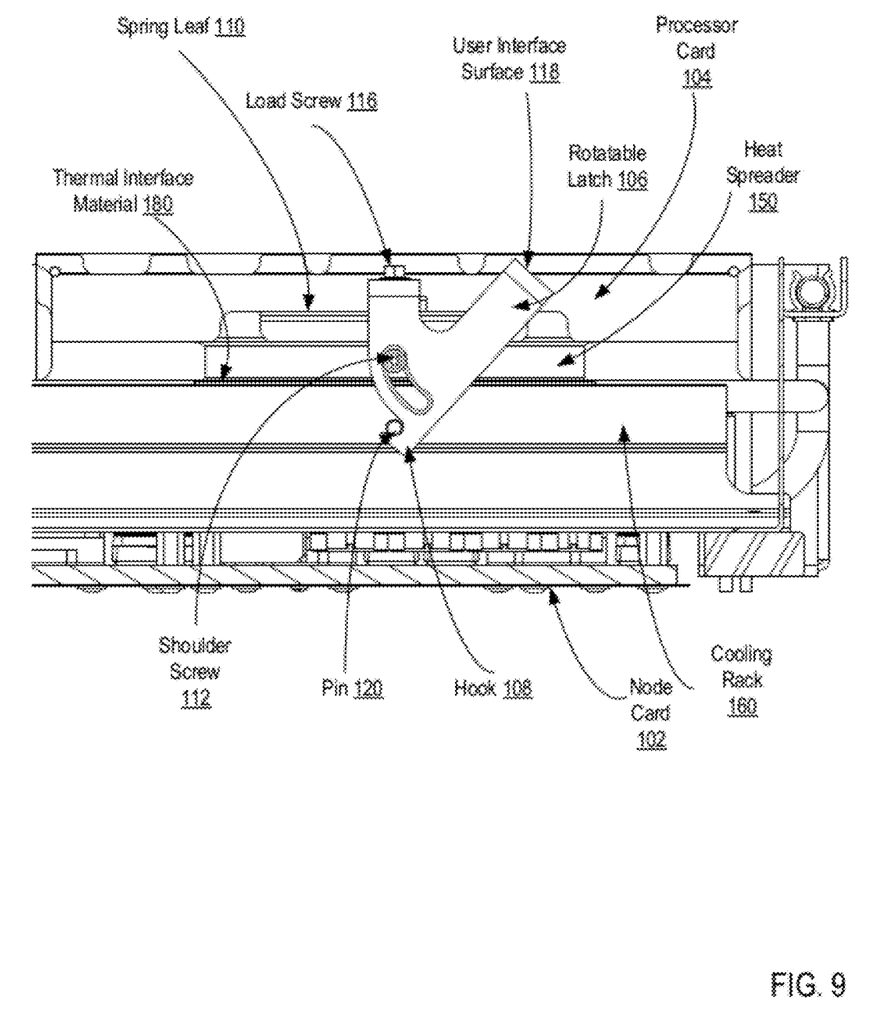
FIG. 9 sets forth a diagram of another example of an apparatus that includes a rotatable latch for compressing thermal interface material between a heat generating electrical component and a cooling electrical component in accordance with the present invention.

FIG. 9 sets forth a diagram of another example of an apparatus that includes a rotatable latch (106) for compressing thermal interface material (180) between a heat generating electrical component and a cooling electrical component. The apparatus of FIG. 9 is similar to the apparatus of FIG. 1 in that it includes the spring leaf (110), the load screw (116), the rotatable latch (106), the processor card (104), and the node card (102). FIG. 9 shows the processor card (104) inserted into the node card (102). The rotatable latch (106) of FIG. 9 is in the locked state. The load screw (116) of FIG. 9 is threaded all the way into the rotatable latch (106). The degree to which the load screw (116) is threaded into the rotatable latch (106) controls the amount of the force that the spring leaf (110) applies to the load screw (116). Threading the load screw (116) into the rotatable latch (106) increases the compression of the thermal interface material (180). In addition, threading the load screw (116) acts to prevent a connection interface (170) of the processor card (104) from disengaging from the node card (102).

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An apparatus for compression of a thermal interface material between a heat generating electrical component and a cooling electrical component, the apparatus comprising:
    a rotatable latch fastened to the heat generating electrical component, the rotatable latch including a hook; wherein when the rotatable latch is in an engaged position, the hook of the rotatable latch engages a pin extending from the cooling electrical component such that the thermal interface material adhered to the heat generating electrical component is coupled to the cooling component; wherein when the rotatable latch is in an unengaged position, the hook of the rotatable latch is not engaged with the pin of the cooling electrical component;
    a load screw; wherein when the rotatable latch is in the engaged position, threading the load screw into the rotatable latch moves the rotatable latch into a locked state; wherein the load screw controls the compression of the thermal interface material between the heat generating electrical component and the cooling electrical component; and
    a spring leaf that is coupled to the heat generating electrical component;
    wherein when the rotatable latch is in the locked state, the spring leaf applies a force to the load screw such that the thermal interface material is compressed.

2. The apparatus of claim 1, wherein unthreading the load screw from the rotatable latch decreases the compression of the thermal interface material.

3. The apparatus of claim 1, wherein threading the load screw into the rotatable latch increases the compression of the thermal interface material.

4. The apparatus of claim 1, wherein threading the load screw into the rotatable latch acts to prevent a connection interface of the heat generating electrical component from disengaging from the cooling electrical component.

5. The apparatus of claim 1, wherein the heat generating electrical component includes a heat spreader of a processor card; wherein the cooling electrical component includes a cooling rack of a node card.

6. The apparatus of claim 1, further comprising a shoulder screw that fastens the rotatable latch to the heat generating electrical component.

7. The apparatus of claim 6, wherein the rotatable latch includes a slot in which the shoulder screw slides as the rotatable latch changes between the engaged position and the unengaged position.

8. The apparatus of claim 1, wherein the rotatable latch includes a user interface surface through which a user controls the movement of the rotatable latch between the engaged position and the unengaged position.

9. The apparatus of claim 1, wherein the spring leaf is coupled to the processor card at two connection points, wherein the load screw contacts with the spring leaf in a position that is between the two connection points.

10. The apparatus of claim 1, wherein the spring leaf is a pre-tempered steel plate.

11. A heat dissipation apparatus, the heat dissipation apparatus comprising:
    a heat generating electrical component, wherein a thermal interface material is adhered to the bottom of the heat generating electrical component;
    a cooling electrical component;
    a rotatable latch fastened to the heat generating electrical component, the rotatable latch including a hook; wherein when the rotatable latch is in an engaged position, the hook of the rotatable latch engages a pin extending from the cooling electrical component such that the thermal interface material adhered to the heat generating electrical component is coupled to the cooling component; wherein when the rotatable latch is in an unengaged position, the hook of the rotatable latch is not engaged with the pin of the cooling electrical component;

a load screw; wherein when the rotatable latch is in the engaged position, threading the load screw into the rotatable latch moves the rotatable latch into a locked state; wherein the load screw controls the compression of the thermal interface material between the heat generating electrical component and the cooling electrical component; and a spring leaf that is coupled to the heat generating electrical component;

wherein when the rotatable latch is in the locked state, the spring leaf applies a force to the load screw such that the thermal interface material is compressed.

12. The heat dissipation apparatus of claim 11, wherein unthreading the load screw from the rotatable latch decreases the compression of the thermal interface material.

13. The heat dissipation apparatus of claim 11, wherein threading the load screw into the rotatable latch increases the compression of the thermal interface material.

14. The heat dissipation apparatus of claim 11, wherein threading the load screw into the rotatable latch acts to prevent a connection interface of the heat generating electrical component from disengaging from the cooling electrical component.

15. The heat dissipation apparatus of claim 11, wherein the heat generating electrical component includes a heat spreader of a processor card; wherein the cooling electrical component includes a cooling rack of a node card.

16. The heat dissipation apparatus of claim 11, further comprising a shoulder screw that fastens the rotatable latch to the heat generating electrical component.

17. The heat dissipation apparatus of claim 16, wherein the rotatable latch includes a slot in which the shoulder screw slides as the rotatable latch changes between the engaged position and the unengaged position.

18. The heat dissipation apparatus of claim 11, wherein the rotatable latch includes a user interface surface through which a user controls the movement of the rotatable latch between the engaged position and the unengaged position.

19. The heat dissipation apparatus of claim 11, wherein the spring leaf is coupled to the processor card at two connection points, wherein the load screw contacts with the spring leaf in a position that is between the two connection points.

20. The heat dissipation apparatus of claim 11, wherein the spring leaf is a pre-tempered steel plate.

* * * * *